US012813363B2

(12) United States Patent

Kim et al.

(10) Patent No.: US 12,813,363 B2
(45) Date of Patent: Nov. 24, 2026

(54) PACKAGING SUBSTRATE AND SEMICONDUCTOR PACKAGE COMPRISING THE SAME

(71) Applicant: Absolics Inc., Covington, GA (US)

(72) Inventors: Sungjin Kim, Covington, GA (US); Yong Ha Woo, Gyeonggi-do (KR)

(73) Assignee: Absolics Inc., Covington, GA (US)

( * ) Notice: Subject to any disclaimer, the term of this patent is extended or adjusted under 35 U.S.C. 154(b) by 362 days.

(21) Appl. No.: 18/500,987

(22) Filed: Nov. 2, 2023

(65) Prior Publication Data

US 2024/0170379 A1 May 23, 2024

Related U.S. Application Data

(60) Provisional application No. 63/427,427, filed on Nov. 22, 2022.

(51) Int. Cl.
*H10W 90/00* (2026.01)
*H10W 74/10* (2026.01)

(52) U.S. Cl.
CPC ....... *H10W 90/701* (2026.01); *H10W 74/124* (2026.01)

(58) Field of Classification Search
CPC .. H01L 23/315; H01L 23/5389; H10W 70/60; H10W 74/00; H10W 42/121
See application file for complete search history.

(56) References Cited

U.S. PATENT DOCUMENTS

| | | | | |
|---|---|---|---|---|
| 7,656,015 B2 * | 2/2010 | Wong | H01L 23/5389 | 257/723 |
| 8,035,127 B2 * | 10/2011 | Chia | H01L 24/82 | 257/178 |
| 10,756,054 B1 * | 8/2020 | Huang | H01L 23/3128 | |
| 2010/0084175 A1 * | 4/2010 | Suzuki | H05K 1/0231 | 174/260 |
| 2011/0308848 A1 * | 12/2011 | Ito | H05K 3/045 | 29/829 |
| 2011/0315229 A1 * | 12/2011 | Linder | B01L 3/0293 | 137/1 |
| 2012/0186861 A1 | 7/2012 | Shimizu et al. | | |
| 2014/0332154 A1 * | 11/2014 | Shan | B32B 38/04 | 428/423.1 |

(Continued)

FOREIGN PATENT DOCUMENTS

| | | |
|---|---|---|
| JP | H06234568 | 8/1994 |
| JP | H08167666 | 6/1996 |

(Continued)

*Primary Examiner* — Chad M Dicke
*Assistant Examiner* — Valerie N Newton
(74) *Attorney, Agent, or Firm* — JCIP GLOBAL INC.

(57) ABSTRACT

A packaging substrate according to an embodiment includes a cavity region in which an element is accommodated, and a core substrate in which the cavity region is disposed. The cavity region includes an accommodation portion that is a space formed by recessing a portion of the core substrate, a side surface that is formed on an inner side in a thickness direction of the core substrate and forms an outer periphery of the accommodation portion, and an elastic layer disposed adjacent to the side surface.
An elastic modulus of the elastic layer is 2 GPa to 15 GPa. The packaging substrate may have excellent thermomechanical reliability and long-term durability.

9 Claims, 3 Drawing Sheets

(56) References Cited

U.S. PATENT DOCUMENTS

| | | | | |
|---|---|---|---|---|
| 2015/0014034 | A1* | 1/2015 | Hwang | H05K 3/4697 29/841 |
| 2015/0235935 | A1* | 8/2015 | Lin | H01L 23/49827 438/122 |
| 2016/0307847 | A1 | 10/2016 | Lee et al. | |
| 2017/0096530 | A1* | 4/2017 | Yun | C08G 73/12 |
| 2019/0131224 | A1 | 5/2019 | Choi et al. | |
| 2020/0161274 | A1 | 5/2020 | Lee | |
| 2022/0059423 | A1* | 2/2022 | Manack | H01L 23/49575 |
| 2024/0421116 | A1* | 12/2024 | Cunningham | C08L 27/12 |

FOREIGN PATENT DOCUMENTS

| | | |
|---|---|---|
| JP | 2000086288 | 3/2000 |
| JP | 2003142628 | 5/2003 |
| JP | 2004266074 | 9/2004 |
| JP | 2008258621 | 10/2008 |
| JP | 2012164952 | 8/2012 |
| JP | 2012256675 | 12/2012 |
| JP | 2014130962 | 7/2014 |
| JP | 2015232146 | 12/2015 |
| JP | 2016213466 | 12/2016 |
| JP | 2017193635 | 10/2017 |
| JP | 2019072871 | 5/2019 |
| JP | 2019080030 | 5/2019 |
| JP | 2021097156 | 6/2021 |
| TW | 200300283 | 5/2003 |
| TW | 201112387 | 4/2011 |
| TW | 201506075 | 2/2015 |
| TW | 201720262 | 6/2017 |
| TW | 202136467 | 10/2021 |
| WO | 2015146149 | 10/2015 |
| WO | 2022202427 | 9/2022 |

* cited by examiner

PACKAGING SUBSTRATE AND SEMICONDUCTOR PACKAGE COMPRISING THE SAME

CROSS-REFERENCE TO RELATED APPLICATION

The present application claims priority to Provisional Application No. 63/427,427 filed on Nov. 22, 2022, which is hereby expressly incorporated by reference, in its entirety, into the present application.

BACKGROUND

1. Technical Field

Present disclosure relates to a packaging substrate having excellent thermomechanical reliability and long-term durability, and a semiconductor package including the same.

2. Related Art

In manufacturing electronic components, implementing a circuit on a semiconductor wafer is referred to as a front-end (FE) process, assembling the wafer into a state that can be used in an actual product is referred to as a back-end (BE) process, and a packaging process is included in the BE process.

Four key technologies of the semiconductor industry that enable the rapid development of electronic products in recent years include semiconductor technology, semiconductor packaging technology, manufacturing process technology, and software technology. The semiconductor technology has been developed in various forms such as line widths of a nanometer unit, which is smaller than a micrometer unit, 10 million or more cells, high-speed operation, and high heat dissipation, but the technology of packaging them completely is not being supported yet. Thus, the electrical performance of semiconductors may be determined by the packaging technology and the resulting electrical connection rather than the performance of the semiconductor technology itself.

Ceramic or resin is applied as a material of a packaging substrate. In the case of a ceramic substrate, it is not easy to mount a high-performance and high-frequency semiconductor element thereon due to a high resistance value or high dielectric constant. In the case of a resin substrate, a relatively high-performance and high-frequency semiconductor element may be mounted thereon, but there is a limit in pitch reduction of wirings.

Recently, research is being conducted to apply silicon or glass as a high-end packaging substrate. By forming a through-hole in a silicon or glass substrate and applying a conductive material into the through-hole, a wiring length between an element and a motherboard may be shortened and excellent electrical characteristics may be obtained.

SUMMARY

Problem to Solve

The present disclosure is directed to providing a packaging substrate having excellent thermomechanical reliability and long-term durability, and a semiconductor package including the same.

Means for Solving Problems

A packaging substrate according to one embodiment of the present specification includes a cavity region in which an element is accommodated, and a core substrate in which the cavity region is disposed.

The cavity region includes an accommodation portion that is a space formed by recessing a portion of the core substrate, a side surface that is formed in a thickness direction of the core substrate and forms an outer periphery of the accommodation portion, and an elastic layer disposed adjacent to the side surface.

An elastic modulus of the elastic layer is 2 GPa to 15 GPa.

A thermal expansion coefficient value of the elastic layer may be 30 ppm/° ° C. to 70 ppm/° C.

The packaging substrate may include a redistribution layer disposed on the core substrate.

The redistribution layer may include an insulating layer and an electrically conductive layer disposed in the insulating layer.

A difference value between a thermal expansion coefficient value of the insulating layer and a thermal expansion coefficient value of the elastic layer may be less than or equal to 60 ppm/° C.

A thermal expansion coefficient of the core substrate may be 5 ppm/° ° C. to 20 ppm/° C.

An angle of the side surface of the cavity region with respect to a lower surface of the core substrate may be greater than or equal to 60° and less than 90°.

A minimum value of a thickness of the elastic layer in an in-plane direction of the core substrate may be 2 μm to 45 μm.

The elastic layer may be disposed in contact with the side surface of the cavity region.

An Ra value (an arithmetic average roughness) of the side surface of the cavity region may be 1 μm to 50 μm.

A surface energy of the elastic layer may be 15 dyne/cm to 35 dyne/cm.

The packaging substrate may include a buffer layer disposed under the core substrate.

A thermal expansion coefficient of the buffer layer may be 10 ppm/° ° C. to 50 ppm/° C.

A packaging substrate according to another embodiment of the present specification includes a cavity region in which an element is accommodated, and a core substrate in which the cavity region is disposed.

The cavity region includes an accommodation portion that is a space formed by recessing a portion of the core substrate, two or more elements accommodated in the accommodation portion, and an elastic layer disposed in at least a portion of a space formed between the elements, An elastic modulus of the elastic layer is 2 GPa to 15 GPa.

A semiconductor package according to still another embodiment of the present specification includes a packaging substrate and a main board electrically connected to the packaging substrate.

Effect of Invention

The packaging substrate, etc. of present disclosure may present superior thermal mechanical reliability and long-term durability.

DESCRIPTION OF EXEMPLARY EMBODIMENTS

Figure 1A:
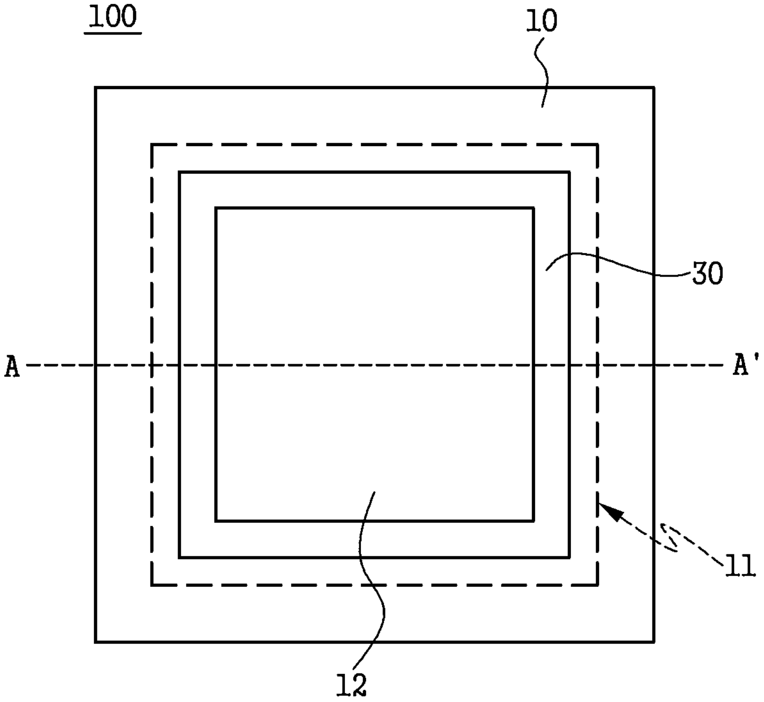
FIG. 1*a* is a plan view illustrating a packaging substrate according to one embodiment of the present specification.

Hereinafter, embodiments will be described in detail with reference to the accompanying drawings so that a person skilled in the art to which the present disclosure pertains could easily implement. However, the present disclosure may be implemented in many different forms and is not limited to the embodiments described herein. Like reference numerals designate like components throughout the specification.

Throughout the present specification, the phrase "combination(s) thereof" included in a Markush-type expression refers to one or more mixtures or combinations selected from the group consisting of components stated in the Markush-type expression, that is, denotes that one or more components selected from the group consisting of the components are included.

Throughout the present specification, terms such as "first," "second," "A," or "B" are used to distinguish the same terms from each other. In addition, the singular forms include the plural form unless the context clearly dictates otherwise.

In the present specification, the term "~based" may mean that a compound includes a compound corresponding to "~", or a derivative of "~".

In the present specification, "B being disposed on A" means that B is disposed in direct contact with A or disposed over A with another layer interposed therebetween and thus should not be interpreted as being limited to B being disposed in direct contact with A.

In the present specification, "B being connected to A" means that B is connected to A directly or through another component therebetween, and thus should not be interpreted as being limited to B being directly connected to A, unless otherwise noted.

In the present specification, unless specially stated otherwise, a singular form is contextually interpreted as including a plural form as well as a singular form.

In the drawings of the present specification, the shape, relative size, angle, and the like of each component may be exaggerated for the purpose of illustration, and no rights shall be construed to be limited to the drawings.

In the present specification, "A being adjacent to B" means that A and B are located in contact with each other, or A and B are not in contact with each other but are located close to each other. In the present specification, unless specially stated otherwise, the expression that A and B are adjacent to each other shall not be construed as limiting that A and B are located in contact with each other.

In the present specification, unless otherwise stated, the term "fine line" refers to a line having a width of 5 μm or less, and illustratively refers to a line having a width of 1 to 4 μm.

In the present specification, a difference value between A value and B value refers to an absolute value of a value obtained by subtracting B value from A value.

In the present specification, unless specially stated otherwise, physical property values of each component in a packaging substrate are interpreted as measured at room temperature. The room temperature is 20° ° C. to 25° C.

A manufacturing process of a semiconductor having an element disposed in a cavity of a core substrate includes mounting the semiconductor element in the cavity and forming multiple build-up layers on the core substrate. The build-up layers are formed by repeated heating and cooling processes tens to hundreds of times. In this process, stress is repeatedly applied to the element due to a mismatch in thermal expansion coefficients between the element and the substrate, and a problem such as breakage of the element or the substrate or breakage of electrical connection between the element and another component in the package may occur.

In addition, heat is generated in a process of operating the element in the packaging substrate, which causes thermal expansion of the core substrate and a main board. In this case, due to a difference in thermal expansion characteristics between the core substrate and the main board, bending of the core substrate may occur, and reliability of the element embedded in the packaging substrate and the substrate may be deteriorated. These problems frequently occur especially when sizes of the substrate and the element increases.

The inventors of present disclosure have confirmed that, by applying an elastic layer to a cavity region and adjusting an elastic modulus or the like of the elastic layer, it is possible to provide a packaging substrate or the like having excellent thermomechanical reliability and long-term durability, and have completed the embodiments.

Hereinafter, the present disclosure will be described in detail.

Structure of Packaging Substrate

Figure 1B:
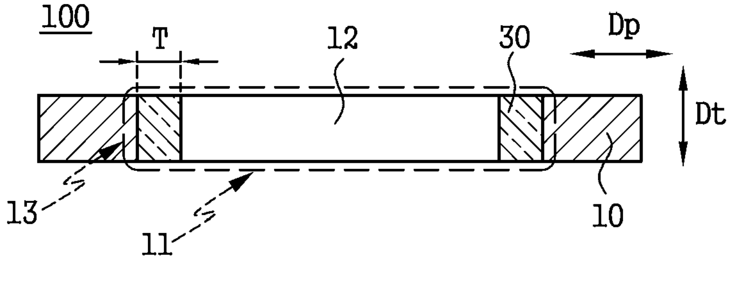
FIG. 1*b* is a cross-sectional view taken along line A-A' of FIG. 1*a*.

FIG. 1*a* is a plan view illustrating a packaging substrate 100 according to one embodiment of the present specification. FIG. 1*b* is a cross-sectional view taken along line A-A' of FIG. 1*a*. The packaging substrate 100 of the present disclosure will be described with reference to FIGS. 1*a* and 1*b*.

The packaging substrate 100 according to one embodiment of the present specification includes a cavity region 11 in which an element 20 is accommodated, and a core substrate 10 in which the cavity region 11 is disposed.

The core substrate 10 serves as a support in the packaging substrate 100. The core substrate 10 is distinguished from a redistribution layer or bump disposed on or under the core substrate 10.

As the core substrate 10, a substrate selected from a ceramic substrate, a glass substrate, or a combination thereof may be applied.

As the ceramic substrate, for example, a silicon-based ceramic substrate, a glass-based ceramic substrate, or the like may be applied. The silicon-based ceramic substrate may be a substrate including some or all of a silicon substrate, a silicon carbide substrate, and the like. The glass-based ceramic substrate may be a substrate including some or all of a quartz substrate, a sapphire substrate, and the like.

As the glass substrate, for example, an alkali-borosilicate plate glass, an alkali-free borosilicate plate glass, an alkali-free alkaline earth borosilicate plate glass, or the like may be applied, as long as it is a plate glass applied as an electronic component. As the glass substrate, a glass substrate for an electronic device may be applied, and a glass substrate manufactured by, for example, SCHOTT, AGC, Corning, or the like may be applied, but the present disclosure is not limited thereto.

A thickness of the core substrate 10 may be greater than or equal to 50 μm. The thickness may be greater than or equal to 100 μm. The thickness may be greater than or equal to 250 μm. The thickness may be greater than or equal to 400 μm. The thickness may be greater than or equal to 500 μm. The thickness may be less than or equal to 3000 μm. The thickness may be less than or equal to 2000 μm. The thickness may be less than or equal to 1000 μm. In this case, the thickness refers to a thickness of the core substrate in a portion excluding the cavity region. When the core substrate having such a thickness is applied, the core substrate may have excellent utilization as a substrate for semiconductor packaging.

The cavity region 11 includes an accommodation portion 12 that is a space formed by recessing a portion of the core substrate 10, a side surface 13 that is formed in a thickness direction Dt of the core substrate and forms an outer periphery of the accommodation portion 12, and an elastic layer 30 disposed adjacent to the side surface 13.

The accommodation portion 12 may be formed by vertically passing through the core substrate 10 (see FIG. 1*b*). However, the present disclosure is not limited thereto, and the accommodation portion 12 may be formed by partially recessing an upper or lower surface of the core substrate 10 rather than vertically passing through the core substrate 10.

The side surface 13 of the cavity region may be formed perpendicular to the upper or lower surface of the core substrate 10, but the present disclosure is not limited thereto. When observing the core substrate 10 in a cross section, the side surface 13 of the cavity region may form an inclined surface or a curved surface.

The element may be mounted in the accommodation portion 12. As the element, not only a semiconductor element such as a central processing unit (CPU), a graphics processing unit (GPU), a memory chip, or the like, but also a capacitor element, a transistor element, an impedance element, other modules, or the like may be applied. That is, any semiconductor element mounted on a semiconductor device may be applied as the element without limitation.

The elastic layer 30 may be disposed adjacent to the side surface 13 of the cavity region. The elastic layer 30 may have a function of stably fixing the element mounted in the cavity region 11, while buffering stress applied to the element due to thermal expansion of the core substrate 10 during repeated heating/cooling processes.

The elastic layer 30 may be disposed in contact with the side surface 13 of the cavity region. The elastic layer 30 may be disposed to be spaced apart from the side surface 13 of the cavity region.

A heat dissipation layer (not shown) may be disposed between the elastic layer 30 and the side surface 13 of the cavity region. The heat dissipation layer may effectively suppress overheating of the packaging substrate by discharging heat that is generated in the cavity region during element operating to the outside of the packaging substrate.

As the heat dissipation layer, a separate heat dissipation material may be applied, and a metal layer having both electrical conductivity and heat dissipation characteristics may be applied. When a metal layer is applied as the heat dissipation layer, the metal layer may be grounded to the outside and may be disposed in a form embedded in a separate material having insulating properties.

A binder resin including a filler may be applied as a material of the heat dissipation layer. A material having high thermal conductivity may be applied as the filler. As an example, an epoxy resin may be applied as the binder resin, and a metal filler and a carbonaceous filler may be applied as the filler.

A thermal conductivity of the heat dissipation layer may be 300 W/mK to 450 W/mK. The same material as an electrically conductive layer included in the redistribution layer described at the below may be applied to the heat dissipation layer.

The elastic layer 30 may be disposed in contact with the element mounted in the cavity region. The elastic layer 30 may be disposed to be spaced apart from the element mounted in the cavity region.

As a method of forming the elastic layer 30, a method may be applied in which an element is mounted in the accommodation portion 12, and then a heated and pressed resin film or resin composition for manufacturing an elastic layer is embedded in a space formed around the element and cured, but the present disclosure is not limited thereto. For example, a method of disposing an elastic layer, which has been cured and molded, in an inner space in a cavity region may be applied.

In the present disclosure, a thickness T of the elastic layer 30 in an in-plane direction Dp of the core substrate may be controlled. This may help the elastic layer to stably fix the element while effectively buffering thermal stress applied to the element.

The thickness may be measured by transmission electron microscope (TEM) analysis. However, the thickness may be measured through another method in addition to the TEM analysis.

The thickness T of the elastic layer 30 in the in-plane direction Dp of the core substrate may be 3 μm to 50 μm. The thickness T may be greater than or equal to 5 μm. The thickness T may be greater than or equal to 10 μm. The thickness T may be greater than or equal to 15 μm. The thickness T may be greater than or equal to 20 μm. The thickness T may be greater than or equal to 25 μm. The thickness T may be less than or equal to 45 μm. The thickness T may be less than or equal to 40 μm. In this case, the elastic layer 30 may impart excellent long-term durability to the packaging substrate.

Figure 2:
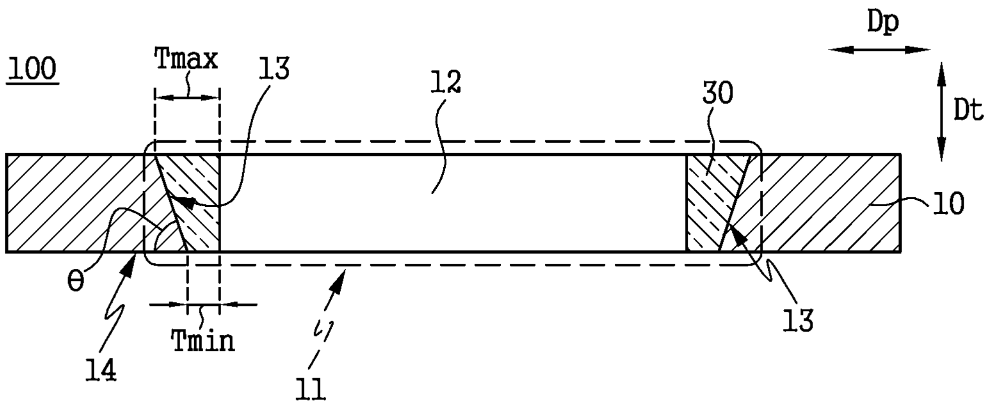
FIG. 2 is a cross-sectional view illustrating a packaging substrate according to another embodiment of the present specification.

FIG. 2 is a conceptual diagram illustrating a packaging substrate 100 according to another embodiment of the present specification. Hereinafter, the present disclosure will be described with reference to FIG. 2.

The packaging substrate 100 includes a cavity region 11 in which an element is accommodated, and a core substrate 10 in which the cavity region 11 is disposed. The specific configurations described in FIGS. 1*a* and 1*b* above are applied to the packaging substrate 100 as they are. Hereinafter, differences will be mainly described.

A side surface 13 of the cavity region may be an inclined plane or a curved surface. The term "inclined" means that the side surface 13 is not substantially parallel to a thickness direction Dt of the core substrate.

An angle θ of the side surface 13 of the cavity region with respect to a lower surface 14 of the core substrate may be greater than or equal to 60° and less than 90°. A minimum value Tmin of a thickness of an elastic layer 30 in an in-plane direction Dp of the core substrate may be 2 μm to 45 μm In the present disclosure, by simultaneously controlling the angle θ of the side surface 13 of the cavity region with respect to the lower surface 14 of the core substrate and the thickness range of the elastic layer 30, a space between an element (not shown) mounted in the cavity region 11 and the side surface 13 of the cavity region may be adjusted. Accordingly, a heated and pressed resin film for manufacturing an elastic layer may be smoothly embedded in the space, and the occurrence of voids in the elastic layer 30 may be effectively suppressed. At the same time, a stable stress buffering function may be provided to the elastic layer 30.

The angle θ may be greater than or equal to 60° and less than 90°. The angle θ may be greater than or equal to 70°. The angle θ may be greater than or equal to 75°. The angle θ may be less than or equal to 89°. The angle may be less than or equal to 87°.

The minimum value Tmin may be 2 μm to 45 μm. The minimum value Tmin may be greater than or equal to 3 μm. The minimum value Tmin may be greater than or equal to 5 μm. The minimum value Tmin may be greater than or equal to 10 μm. The minimum value Tmin may be greater than or equal to 15 μm. The minimum value Tmin may be greater than or equal to 20 μm. The minimum value Tmin may be less than or equal to 40 μm. The minimum value Tmin may be less than or equal to 35 μm.

In this case, the elastic layer may effectively protect the element from thermal stress while stably fixing the element seated in the cavity region.

A maximum value Tmax of the thickness of the elastic layer 30 in the in-plane direction Dp of the core substrate may be 3 μm to 50 μm. The maximum value Tmax may be greater than or equal to 5 μm. The maximum value Tmax may be greater than or equal to 10 μm. The maximum value Tmax may be greater than or equal to 15 μm. The maximum value Tmax may be greater than or equal to 20 μm. The maximum value Tmax may be greater than or equal to 25 μm. The maximum value Tmax may be less than or equal to 45 μm. The maximum value Tmax may be less than or equal to 40 μm. In this case, a resin film or a resin composition for an elastic layer melted during an elastic layer formation process may be smoothly filled into an inner space around the element.

The thickness may be measured by TEM (Transmission Electron Microscope) analysis.

Figure 3:
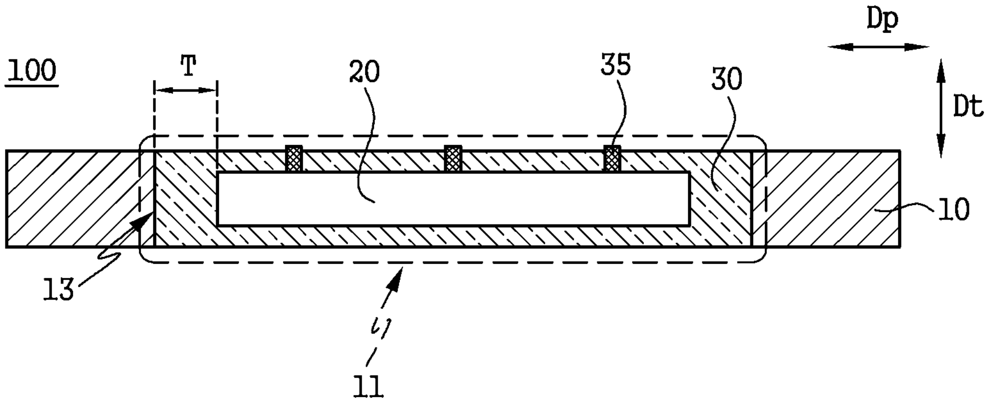
FIG. 3 is a cross-sectional view illustrating a packaging substrate according to still another embodiment of the present specification.

FIG. 3 is a conceptual diagram illustrating a packaging substrate according to still another embodiment of the present specification. Hereinafter, the present disclosure will be described with reference to FIG. 3.

A packaging substrate 100 includes a cavity region 11 in which an element is accommodated, and a core substrate 10 in which the cavity region 11 is disposed. The specific configurations described in FIGS. 1*a*, 1*b*, and 2 above are applied to the packaging substrate 100 as they are. Hereinafter, differences will be mainly described.

The packaging substrate 100 may further include an element 20. The element 20 may be disposed in an accommodation portion 12.

The packaging substrate 100 may have a structure in which the element 20 is embedded in an elastic layer 30. That is, the elastic layer 30 may have a structure surrounding not only a side surface of the element 20 but also an upper surface and/or a lower surface of the element 20. In this case, the elastic layer 30 disposed on the upper surface and/or the lower surface of the element 20 may serve as an insulating layer.

The elastic layer 30 disposed on the upper surface and/or the lower surface of the element 20 may include an electrically conductive layer 35. The electrically conductive layer 35 may have a function of electrically connecting a redistribution layer (not shown), which may be disposed on the core substrate 10, and the element 20.

In the present disclosure, a thickness T of the elastic layer 30 in an in-plane direction Dp of the core substrate may be controlled. The thickness T of the elastic layer 30 in the in-plane direction Dp of the core substrate is measured at the elastic layer 30 located between the side surface 13 of the cavity region and the cavity element 20.

A description of the thickness T of the elastic layer 30 in the in-plane direction Dp of the core substrate overlaps with the above description, and thus will be omitted.

The above-described elastic layer 30 may be formed by a following method. The element 20 may be disposed in a space capable of accommodating an element in the cavity region 11. When the element 20 is disposed in the cavity region 11, an adhesive film may be applied to the element 20 in order to fix the element 20.

Thereafter, an empty space other than the volume occupied by the element 20 in the cavity region 11 is filled with a resin composition for an elastic layer, and the filled resin composition is cured to form the elastic layer 30 on upper and side portions of the element 20. A method of filling the resin composition for an elastic layer includes, for example, a method of injecting the composition using a nozzle such as a syringe, a method of filling the composition through screen printing, or the like.

The elastic layer 30 may also be formed on a lower portion of the element 20 using the same method.

Figure 4:
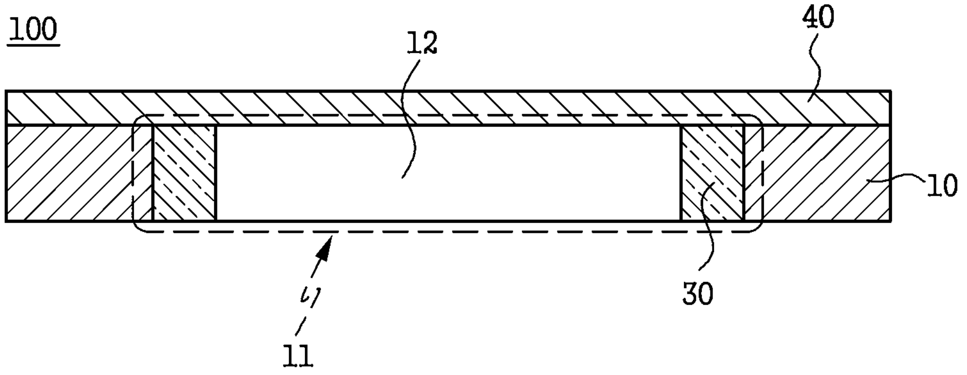
FIG. 4 is a cross-sectional view illustrating a packaging substrate according to yet another embodiment of the present specification.

FIG. 4 is a conceptual diagram illustrating a packaging substrate according to yet another embodiment of the present specification. Hereinafter, the present disclosure will be described with reference to FIG. 4.

A packaging substrate 100 includes a cavity region 11 in which an element is accommodated, and a core substrate 10 in which the cavity region 11 is disposed. The specific configurations described in FIGS. 1A, 1B, 2, and 3 above are applied to the packaging substrate 100 as they are. Hereinafter, differences will be mainly described.

The packaging substrate 100 may include a redistribution layer 40 disposed on the core substrate 10. The redistribution layer 40 may include an insulating layer (not shown) and an electrically conductive layer (not shown) disposed in the insulating layer.

In the redistribution layer 40, the insulating layer and the electrically conductive layer may be disposed together. The redistribution layer 40 may be formed in a form in which the electrically conductive layer having a predetermined position and shape is embedded in the insulating layer. The electrically conductive layer may be formed with fine lines on at least a portion of the redistribution layer 40. The redistribution layer 40 may be electrically connected to the cavity element 20.

The redistribution layer 40 may be formed by a process of repeatedly forming and removing the insulating layer and the electrically conductive layer.

The insulating layer may be formed of a build-up layer material such as an Ajinomoto Build-up Film (ABF) of Ajinomoto Co., Ltd, an undercoat material, or the like, but the present disclosure is not limited thereto.

The electrically conductive layer may include an electrically conductive material. As an example, the electrically conductive layer may include at least one of copper, nickel, aluminum, gold, or silver.

Figure 5:
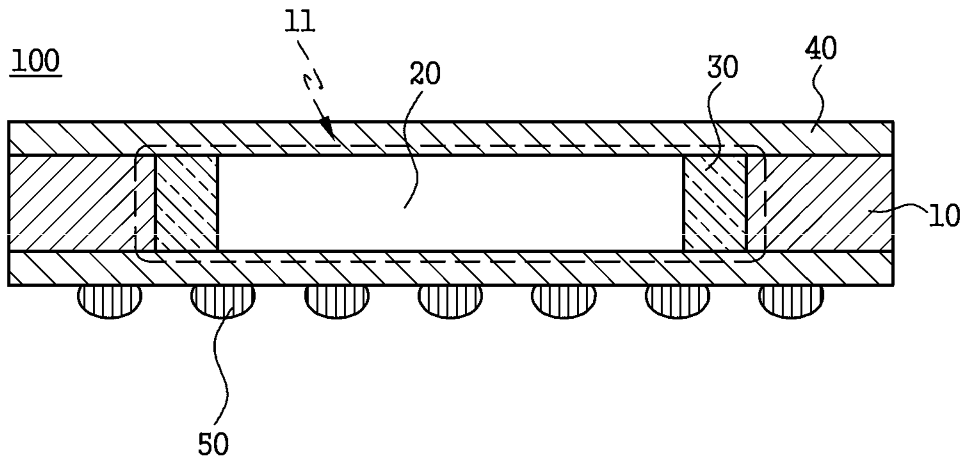
FIG. 5 is a cross-sectional view illustrating a packaging substrate according to yet another embodiment of the present specification.

FIG. 5 is a cross-sectional view illustrating a packaging substrate according to yet another embodiment of the present specification. The present disclsoure will be described with reference to FIG. 5.

A packaging substrate 100 includes a cavity region 11 in which an element is accommodated, and a core substrate 10 in which the cavity region 11 is disposed. The specific configurations described in FIGS. 1*a*, 1*b*, 2, 3, and 4 above are applied to the packaging substrate 100 as they are. Hereinafter, differences will be mainly described.

The packaging substrate 100 includes an element 20 accommodated in an accommodation portion, and may further include a redistribution layer 40 and/or a bump 50 disposed under the core substrate 10.

A description of the redistribution layer 40 disposed under the core substrate 10 overlaps with the above description, and thus will be omitted.

The redistribution layer 40 disposed on the core substrate 10 and the redistribution layer 40 disposed under the core substrate 10 may be electrically connected to each other by an electrically conductive layer (not shown) passing through the core substrate 10 according to a predetermined layout.

The bump 50 may be disposed in a predetermined form under the core substrate 10. As an example, the bump 50 may be disposed on a portion of a lower surface of the packaging substrate 100 so as to be in contact with a main board or the like.

Figure 6:
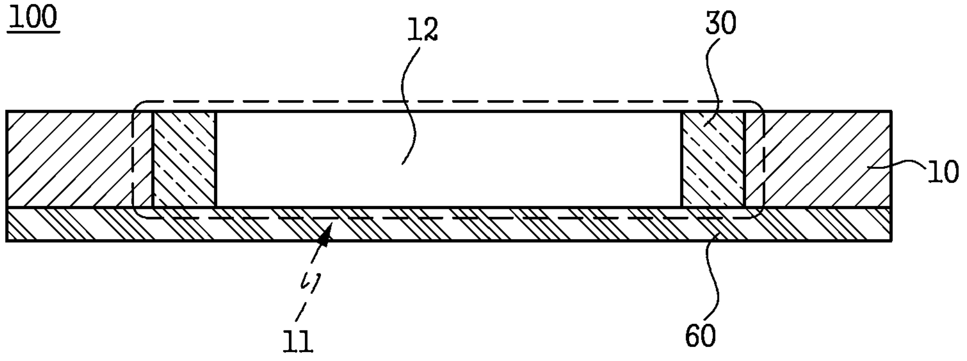
FIG. 6 is a cross-sectional view illustrating a packaging substrate according to yet another embodiment of the present specification.

FIG. 6 is a cross-sectional view illustrating a packaging substrate 100 according to yet another embodiment of the present specification. The present disclsoure will be described with reference to FIG. 6.

The packaging substrate 100 includes a cavity region 11 in which an element is accommodated, and a core substrate 10 in which the cavity region 11 is disposed. The specific configurations described in FIGS. 1*a*, 1*b*, 2, 3, 4, and 5 above are applied to the packaging substrate 100 as they are. Hereinafter, differences will be mainly described.

The packaging substrate 100 may further include a buffer layer 60 disposed under the core substrate 10.

The buffer layer 60 may have thermal expansion characteristics controlled to a range preset in the present disclosure. When the packaging substrate 100 is mounted on a main board (not shown), the buffer layer 60 may have a function of effectively reducing thermal stress caused by a mismatch in thermal expansion coefficients between the core substrate 10 and the main board.

The buffer layer 60 may include an electrically conductive layer (not shown). The electrically conductive layer has a function of electrically connecting an element (not shown) mounted in the cavity region and a redistribution layer (not shown) formed under the core substrate 10.

A material of the buffer layer 60 is not limited as long as it has insulating properties and the thermal expansion characteristics of the buffer layer described above. As an example, as the material of the buffer layer, a thermosetting resin such as an epoxy resin, a thermoplastic resin such as polyimide, or a material including a reinforcing material such as a glass fiber or an inorganic filler included in the thermosetting resin or the thermoplastic resin may be applied.

The redistribution layer may be further included under the buffer layer 60. A description of the redistribution layer overlaps with the above description, and thus, will be omitted.

Figure 7:
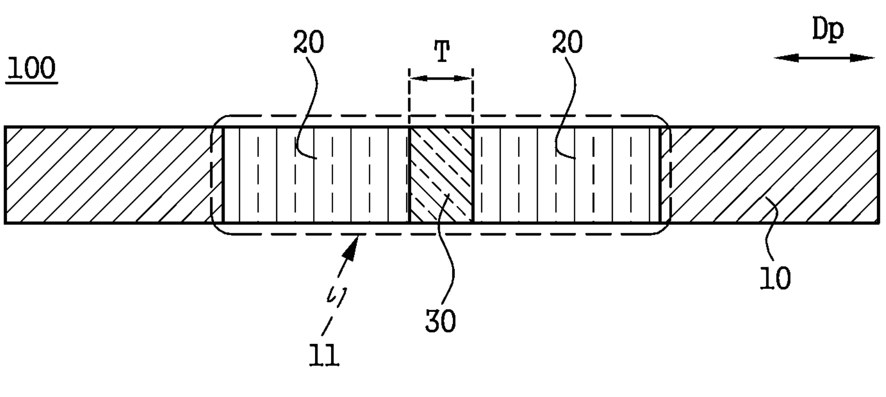
FIG. 7 is a cross-sectional view illustrating a packaging substrate according to yet another embodiment of the present specification.

FIG. 7 is a cross-sectional view illustrating a packaging substrate 100 according to yet another embodiment of the present specification. The present disclosure will be described with reference to FIG. 7.

The packaging substrate 100 includes a cavity region 11 in which an element is accommodated, and a core substrate 10 in which the cavity region 11 is disposed. The specific configurations described in FIGS. 1*a*, 1*b*, 2, 3, 4, 5, and 6 above are applied to the packaging substrate 100 as they are. Hereinafter, differences will be mainly described.

The packaging substrate 100 according to yet another embodiment of the present specification includes the cavity region 11 in which an element 20 is accommodated, and the core substrate 10 in which the cavity region 11 is disposed.

The cavity region 11 includes an accommodation portion (not shown) which is a space formed by recessing a portion of the core substrate 10, two or more elements 20 accommodated in the accommodation portion, and an elastic layer 30 disposed in at least a portion of a space formed between the elements.

At least one of the elements may be disposed to be spaced apart from one or more other elements. That is, a space may be formed between one element and another element.

The elastic layer 30 may effectively relieve stress formed between the elements due to thermal expansion of the core substrate generated during a redistribution layer formation process or an element driving process.

A description of the structures of the core substrate, the element, and the elastic layer overlaps with the above description, and thus will be omitted.

Properties of Elastic Layer

The elastic layer 30 having an elastic modulus value in a range preset in the present disclosure may be applied to a packaging substrate. Specifically, the elastic layer 30 having a lower elastic modulus value compared to the core substrate 10 may stably fix the element 20 seated in the cavity region 11, while effectively preventing the core substrate 10 from cracking due to thermal stress formed between the core substrate 10 and the element 20 in a high temperature environment.

The elastic modulus value of the elastic layer 30 may be measured by dynamic mechanical analysis (DMA).

The elastic modulus of the elastic layer 30 may be 2 GPa to 15 GPa. The elastic modulus may be greater than or equal to 5 GPa. The elastic modulus may be less than or equal to 12 GPa. The elastic modulus may be less than or equal to 10 GPa. In this case, damage to a semiconductor package caused by a mismatch in thermal expansion coefficients between the core substrate and the element may be effectively suppressed.

The elastic layer 30 having controlled thermal expansion characteristics may effectively reduce stress acting on the element 20 due to thermal expansion of the elastic layer 30 itself in a high temperature environment. In addition, a degree of the mismatch in thermal expansion coefficients between the elastic layer 30 and the insulating layer in the redistribution layer 40 is reduced, thereby further improving the reliability of the packaging substrate 100.

A thermal expansion coefficient value of the elastic layer may be 30 ppm/° ° C. to 70 ppm/° C. The thermal expansion coefficient value may be greater than or equal to 35 ppm/° C. The thermal expansion coefficient value may be greater than or equal to 40 ppm/° C. The thermal expansion coefficient value may be less than or equal to 65 ppm/° ° C. The thermal expansion coefficient value may be less than or equal to 60 ppm/° C. In this case, damage to the packaging substrate in an environment exposed to a high temperature may be effectively suppressed.

A difference value between a thermal expansion coefficient value of the insulating layer and the thermal expansion coefficient value of the elastic layer 30 may be less than or equal to 60 ppm/° C. The difference value may be less than or equal to 50 ppm/° C. The difference value may be less than or equal to 40 ppm/° C. The difference value may be less than or equal to 30 ppm/° C. The difference value may be less than or equal to 20 ppm/° C. The difference value may be less than or equal to 10 ppm/° C. The difference value may be greater than or equal to 1 ppm/° C. In this case, damage to an electrical connection due to a mismatch in thermal expansion characteristics between the insulating layer and the elastic layer may be suppressed.

The thermal expansion coefficient may be measured by a thermal mechanical analyzer (TMA) using a thermomechanical analysis method. As an example, the thermal expansion coefficient may be measured using model Q400 TMA produced by TA Instruments, Inc.

The elastic layer 30 may be disposed in contact with the side surface 13 of the cavity region. In this case, roughness characteristics of the side surface 13 of the cavity region may be controlled in a range preset in the present disclosure. Accordingly, an adhesion between the core substrate 10 and the elastic layer 30 may be further improved due to an anchoring effect at an interface between the elastic layer 30 and the side surface 13 of the cavity region in contact with the elastic layer 30.

An Ra value, which is an arithmetic average roughness of the side surface 13 of the cavity region, is measured in accordance with ISO_4287 using a roughness meter.

The Ra value of the side surface 13 of the cavity region may be 1 μm to 50 μm. The Ra value may be greater than or equal to 5 μm. The Ra value may be greater than or equal to 10 μm. The Ra value may be greater than or equal to 15 μm. The Ra value may be less than or equal to 45 μm. The Ra value may be less than or equal to 40 μm. The Ra value may be less than or equal to 35 μm. In this case, the elastic layer may be more stably attached to the side surface of the cavity region.

A surface energy of the elastic layer may be 15 dyne/cm to 35 dyne/cm.

The elastic layer of the present disclosure may have controlled surface energy characteristics. In this case, the elastic layer may have an enhanced affinity for the core substrate made of a glass material so that an adhesion of the elastic layer with respect to a surface of the substrate may be further improved. At the same time, it is possible to prevent electric power loss or heating from being excessively generated during the element operating process by adjusting a dielectric dissipation factor of the elastic layer.

The surface energy of the elastic layer may be measured by a surface analyzer.

The surface energy of the elastic layer may be 15 dyne/cm to 35 dyne/cm. The surface energy may be greater than or equal to 17 dyne/cm. The surface energy may be greater than or equal to 20 dyne/cm. The surface energy may be greater than or equal to 22 dyne/cm. The surface energy may be less than or equal to 32 dyne/cm. The surface energy may be less than or equal to 30 dyne/cm. The surface energy may be less than or equal to 28 dyne/cm. In this case, it is possible to provide the elastic layer having excellent adhesion to the glass substrate and controlled generation of heat due to operating of the element.

Composition of Elastic Layer

The elastic layer 30 may be formed of a resin composition for an elastic layer.

The resin composition for an elastic layer may have the form of a film.

The resin composition for an elastic layer may include an epoxy resin. A cured epoxy resin serves as a matrix resin in the elastic layer 30.

As the epoxy resin, at least one selected from the group consisting of a cresol novolac-type epoxy resin, a dicyclopentadiene-based epoxy resin, a biphenyl-based epoxy resin, a bisphenol A-type epoxy resin, and a cyclic-type epoxy resin may be applied. However, the present disclosure is not limited thereto.

In the present disclosure, an elastomer resin epoxidized with an epoxy resin may be applied. Accordingly, more improved elasticity may be imparted to the elastic layer 30 to help suppress the occurrence of defects in the core substrate and the element.

As the epoxidized elastomer, for example, at least one selected from the group consisting of polymers and copolymers of epoxidized conjugated dienes having 4 to 11 carbon atoms, polymers and copolymers of epoxidized epihalohydrins, epoxidized ethylene/propylene copolymers, and epoxidized conjugated diene butyl elastomers may be applied. However, the present disclosure is not limited thereto.

The epoxy resin may further include an acrylic repeating unit. This may help to adjust the elasticity of the elastic layer 30 to stably fix the cavity element 20.

The resin composition for an elastic layer may further include an imide compound. The imide compound may help the elastic layer 30 to have a relatively low thermal expansion coefficient and improved heat resistance properties. The imide compound may include, for example, at least one of maleimide, nadimide, and itaconimide.

The resin composition for an elastic layer may further include a filler. As the filler, an organic filler and/or an inorganic filler may be applied.

The inorganic filler included in the resin composition for an elastic layer has a function of lowering the thermal expansion coefficient of the elastic layer 30. As the inorganic filler, for example, at least one selected from the group consisting of fillers made of talc, silica, talc, calcium carbonate, mica, quartz, glass fiber, graphite, and alumina. However, the present disclosure is not limited thereto.

The organic filler in the resin composition for an elastic layer may help the elastic layer 30 to have more improved elasticity. As the organic filler, for example, block copolymers such as poly methyl methacrylate-b-poly butyl acrylate-b-poly methyl methacrylate, carboxyl-terminated butadiene acrylate (CTBN), and the like may be applied. However, the present disclosure is not limited thereto.

The resin composition for an elastic layer may further include a curing agent. The curing agent has a function of initiating a crosslinking reaction of the epoxy resin. As the curing agent, for example, an amine-based compound, a carboxylic acid-based compound, a phenolic-based compound, and the like may be applied.

Thermal Expansion Characteristics of Each Component of Packaging Substrate

In the present disclosure, a difference value of thermal expansion coefficient values between each component constituting the packaging substrate 100 may be adjusted.

Accordingly, stress applied to the cavity element 20 or the core substrate 10 in the process of forming the build-up layer on the core substrate 10 or under the element operating process may be effectively reduced.

The thermal expansion coefficient for each component may be measured by a thermal mechanical analyzer (TMA) using a thermomechanical analysis method. As an example, the thermal expansion coefficient may be measured using model Q400 TMA produced by TA Instruments, Inc.

A difference value between the thermal expansion coefficient value of the core substrate 10 and the thermal expansion coefficient value of the cavity element 20 may be less than or equal to 15 ppm/° C. The difference value may be less than or equal to 10 ppm/° C. The difference value may be less than or equal to 5 ppm/° C. The difference value may be greater than or equal to 1 ppm/° C. Accordingly, excessive stress may be prevented from being formed in the semiconductor package during the process of forming the redistribution layer 40.

A difference value between the thermal expansion coefficient value of the insulating layer and the thermal expansion coefficient value of the core substrate 10 may be less than or equal to 25 ppm/° C. The difference value may be less than or equal to 23 ppm/° C. The difference value may be less than or equal to 20 ppm/° C. The difference value may be less than or equal to 17 ppm/° C. The difference value may be greater than or equal to 1 ppm/° C. In this case, damage to an electrical connection in the packaging substrate due to a mismatch in thermal expansion coefficients of the insulating layer and the core substrate may be effectively suppressed.

The thermal expansion coefficient value of the core substrate 10 may be 5 ppm/° ° C. to 20 ppm/° C. The thermal expansion coefficient value may be less than or equal to 15 ppm/° C. The thermal expansion coefficient value may be less than or equal to 12 ppm/° C. The thermal expansion coefficient value may be less than or equal to 10 ppm/° C. In this case, the excessive expansion of the core substrate in the process of forming the redistribution layer 40 may be suppressed, while effectively suppressing the deterioration of board level reliability due to a mismatch in thermal expansion characteristics between the main board and the core substrate during the element driving process.

The thermal expansion coefficient value of the insulating layer may be 5 ppm/° ° C. to 40 ppm/° C. The thermal expansion coefficient value may be less than or equal to 35 ppm/° C. The thermal expansion coefficient value may be less than or equal to 30 ppm/° C. The thermal expansion coefficient value may be less than or equal to 25 ppm/° C. The thermal expansion coefficient value may be greater than or equal to 10 ppm/° C. In this case, in the thermal expansion characteristics, a degree of the mismatch in thermal expansion coefficients between the insulating layer and the core substrate, and the insulating layer and the electrically conductive layer may be reduced.

The thermal expansion coefficient value of the element 20 may be less than or equal to 10 ppm/° C. The thermal expansion coefficient value may be less than or equal to 7 ppm/° C. The thermal expansion coefficient value may be greater than or equal to 1 ppm/° C.

The thermal expansion coefficient value of the buffer layer 60 may be 10 ppm/° ° C. to 50 ppm/° C. The thermal expansion coefficient value may be greater than or equal to 15 ppm/° C. The thermal expansion coefficient value may be greater than or equal to 20 ppm/° C. The thermal expansion coefficient value may be less than or equal to 45 ppm/° C. The thermal expansion coefficient value may be less than or equal to 40 ppm/° C. In this case, a degree of bending of the core substrate due to the thermal expansion coefficient mismatch between the core substrate and the main board may be effectively reduced.

Semiconductor Package

A semiconductor package according to another embodiment of the present specification includes a packaging substrate and a main board (not shown) electrically connected to the packaging substrate.

The packaging substrate may be mounted on the main board and electrically connected to the main board.

The main board is not limited as long as it is commonly applied in the field of semiconductor devices.

A description of the packaging substrate overlaps with the above description, and thus will be omitted.

A difference value between a thermal expansion coefficient value of the main board and a thermal expansion coefficient value of a core substrate may be 10 ppm/° ° C. to 50 ppm/° C. The difference value may be less than or equal to 45 ppm/° C. The difference value may be less than or equal to 40 ppm/° ° C. In this case, the bending of the core substrate due to a thermal expansion coefficient mismatch between the core substrate and the main board may be effectively reduced.

While preferable embodiments have been described in detail above, the right scope of the present invention is not limited thereto, but encompasses several modifications and improvements by those skilled in the art using basic concepts of the present invention defined by the appended claims.

DESCRIPTION OF REFERENCE NUMBER

- 100: packaging substrate
- 10: core substrate 11: cavity region 12: accommodation portion
- 13: side surface of the cavity region 14: lower surface of the core substrate
- 20: element
- 30: elastic layer
- 35: electrically conductive layer
- 40: redistribution layer
- 50: bump
- 60: buffer layer
- T: thickness of elastic layer in direction of the core substrate
- Tmax: maximum thickness of elastic layer in direction of the core substrate
- Tmin: minimum thickness of elastic layer in direction of the core substrate
- Dt: thickness direction of the core substrate
- Dp: in-plane direction of the core substrate
- θ: angle of the side surface of the cavity region with respect to a lower surface of the core substrate

The invention claimed is:

1. A packaging substrate comprising:

a cavity region in which an element is accommodated; and a core substrate in which the cavity region is disposed, wherein the cavity region comprises an accommodation portion that is a space formed by recessing a portion of the core substrate, a side surface that is formed in a thickness direction of the core substrate and forms an outer periphery of the accommodation portion, and an elastic layer disposed in contact with the side surface of the cavity region, wherein an elastic modulus of the elastic layer is 2 GPa to 15 GPa, and wherein an Ra value (an arithmetic average roughness) of the side surface of the cavity region is 1 μm to 50 μm.

2. The packaging substrate of claim 1, wherein a thermal expansion coefficient value of the elastic layer is 30 ppm/° C. to 70 ppm/° C.

3. The packaging substrate of claim 1, comprising a redistribution layer disposed on the core substrate, wherein the redistribution layer comprises an insulating layer and an electrically conductive layer disposed in the insulating layer, and a difference value between a thermal expansion coefficient value of the insulating layer and a thermal expansion coefficient value of the elastic layer is less than or equal to 60 ppm/° C.

4. The packaging substrate of claim 1, wherein a thermal expansion coefficient of the core substrate is from 5 ppm/° C. to 20 ppm/° C.

5. The packaging substrate of claim 1, wherein an angle of the side surface of the cavity region with respect to a lower surface of the core substrate is greater than or equal to 60° and less than 90°, and a minimum value of a thickness of the elastic layer in an in-plane direction of the core substrate is 2 μm to 45 μm.

6. The packaging substrate of claim 1, wherein a surface energy of the elastic layer is 15 dyne/cm to 35 dyne/cm.

7. The packaging substrate of claim 1, comprising a buffer layer disposed under the core substrate, wherein a thermal expansion coefficient of the buffer layer is 10 ppm/° C. to 50 ppm/° C.

8. A semiconductor package comprising:

the packaging substrate according to claim 1; and a main board electrically connected to the packaging substrate.

9. A packaging substrate comprising:

a cavity region in which an element is accommodated; and a core substrate in which the cavity region is disposed, wherein the cavity region comprises an accommodation portion that is a space formed by recessing a portion of the core substrate, a side surface that is formed in a thickness direction of the core substrate and forms an outer periphery of the accommodation portion, two or more elements accommodated in the accommodation portion, and an elastic layer disposed in at least a portion of a space formed between the elements, wherein an elastic modulus of the elastic layer is 2 GPa to 15 GPa, and wherein an Ra value (an arithmetic average roughness) of the side surface of the cavity region is 1 μm to 50 μm.

* * * * *